United States Patent
Khoshnevisan et al.

(10) Patent No.: US 11,057,153 B2
(45) Date of Patent: Jul. 6, 2021

(54) MULTI-USER DATA PACKET

(71) Applicant: QUALCOMM Incorporated, San Diego, CA (US)

(72) Inventors: Mostafa Khoshnevisan, San Diego, CA (US); Rajat Prakash, San Diego, CA (US); Junyi Li, Chester, NJ (US); Chong Li, Weehawken, NJ (US); Piyush Gupta, Bridgewater, NJ (US); Peerapol Tinnakornsrisuphap, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/401,952

(22) Filed: May 2, 2019

(65) Prior Publication Data

US 2019/0349130 A1   Nov. 14, 2019

Related U.S. Application Data

(60) Provisional application No. 62/670,179, filed on May 11, 2018.

(51) Int. Cl.
*H04L 1/00* (2006.01)
*H04L 5/00* (2006.01)
(Continued)

(52) U.S. Cl.
CPC .......... *H04L 1/0061* (2013.01); *H03M 13/09* (2013.01); *H04L 1/0003* (2013.01);
(Continued)

(58) Field of Classification Search
None
See application file for complete search history.

(56) References Cited

U.S. PATENT DOCUMENTS

| 2013/0039272 A1* | 2/2013 | Chen | H04W 72/042 |
| | | | 370/328 |
| 2014/0233541 A1* | 8/2014 | Kim | H04L 5/0037 |
| | | | 370/336 |

(Continued)

FOREIGN PATENT DOCUMENTS

WO   WO-2014187358 A1   11/2014

OTHER PUBLICATIONS

M. Wang et al., "The Evolution of LTE Physical Layer Control Channels," in IEEE Communications Surveys & Tutorials, vol. 18, No. 2, pp. 1336-1354, Secondquarter2016, doi: 10.1109/COMST.2015.2510371. (Year: 2016).*

(Continued)

*Primary Examiner* — Daniel F. McMahon
(74) *Attorney, Agent, or Firm* — Kevin T. Cheatham

(57) ABSTRACT

Certain aspects of the present disclosure provide techniques for a multi-user data packet, such as a physical downlink shared channel (PDSCH) packet. A method by a base station (BS) includes sending a control channel, such as physical downlink control channel (PDCCH), scheduling a plurality of user equipment (UEs) for a data packet transmission and sending data for the plurality of UEs in a single transport block on the scheduled data packet. The UE receives the control channel and data packet, and determines the data in the multi-user data packet that is intended for the UE.

29 Claims, 10 Drawing Sheets

(51) Int. Cl.
*H04W 76/27* (2018.01)
*H03M 13/09* (2006.01)

(52) U.S. Cl.
CPC .......... *H04L 1/0009* (2013.01); *H04L 5/0055* (2013.01); *H04W 76/27* (2018.02)

(56) References Cited

U.S. PATENT DOCUMENTS

| | | | |
|---|---|---|---|
| 2015/0009952 A1* | 1/2015 | Berggren | H04L 5/0044 370/330 |
| 2016/0100422 A1* | 4/2016 | Papasakellariou | H04L 1/1861 370/329 |
| 2018/0019794 A1* | 1/2018 | Kowalski | H04W 52/346 |
| 2018/0098337 A1* | 4/2018 | Lee | H04W 72/1278 |
| 2018/0317207 A1* | 11/2018 | Liao | H04L 5/0094 |
| 2019/0223084 A1* | 7/2019 | John Wilson | H04W 48/12 |
| 2019/0223204 A1* | 7/2019 | Kim | H04W 72/14 |
| 2019/0349130 A1* | 11/2019 | Khoshnevisan | H04L 5/0091 |
| 2020/0245314 A1* | 7/2020 | Hwang | H04W 72/0406 |

OTHER PUBLICATIONS

International Search Report and Written Opinion—PCT/US2019/030583—ISA/EPO—dated Jul. 29, 2019.

* cited by examiner

700

| Header | Common Data |

MULTI-USER DATA PACKET

CROSS-REFERENCE TO RELATED APPLICATION(S)

This application claims benefit of and priority to U.S. Provisional Patent Application Ser. No. 62/670,179, filed May 11, 2018, herein incorporated by reference in its entirety as if fully set forth below and for all applicable purposes.

BACKGROUND

Field of the Disclosure

Aspects of the present disclosure relate to wireless communications, and more particularly, to techniques for a multi-user data packet, such as a physical downlink shared channel (PDSCH) packet.

Description of Related Art

Wireless communication systems are widely deployed to provide various telecommunication services such as telephony, video, data, messaging, broadcasts, etc. These wireless communication systems may employ multiple-access technologies capable of supporting communication with multiple users by sharing available system resources (e.g., bandwidth, transmit power, etc.). Examples of such multiple-access systems include 3rd Generation Partnership Project (3GPP) Long Term Evolution (LTE) systems, LTE Advanced (LTE-A) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems, to name a few.

In some examples, a wireless multiple-access communication system may include a number of base stations (BSs), which are each capable of simultaneously supporting communication for multiple communication devices, otherwise known as user equipments (UEs). In an LTE or LTE-A network, a set of one or more base stations may define an eNodeB (eNB). In other examples (e.g., in a next generation, a new radio (NR), or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more DUs, in communication with a CU, may define an access node (e.g., which may be referred to as a BS, 5G NB, next generation NodeB (gNB or gNodeB), transmission reception point (TRP), etc.). A BS or DU may communicate with a set of UEs on downlink channels (e.g., for transmissions from a BS or DU to a UE) and uplink channels (e.g., for transmissions from a UE to BS or DU).

These multiple access technologies have been adopted in various telecommunication standards to provide a common protocol that enables different wireless devices to communicate on a municipal, national, regional, and even global level. NR (e.g., new radio or 5G) is an example of an emerging telecommunication standard. NR is a set of enhancements to the LTE mobile standard promulgated by 3GPP. NR is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL). To these ends, NR supports beamforming, multiple-input multiple-output (MIMO) antenna technology, and carrier aggregation.

However, as the demand for mobile broadband access continues to increase, there exists a need for further improvements in NR and LTE technology. Preferably, these improvements should be applicable to other multi-access technologies and the telecommunication standards that employ these technologies.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Aspects of the present disclosure relate to scheduling, format, and transmission of a multi-user data packet, such as a physical downlink shared channel (PDSCH) packet.

Certain aspects provide a method for wireless communication by a base station (BS). The method generally includes sending a physical downlink control channel (PDCCH) scheduling a plurality of user equipment (UEs) for a PDSCH transmission. The BS sends data for the plurality of UEs in a single transport block on the scheduled PDSCH.

In some examples, the PDCCH carries a single downlink control information (DCI) including a downlink grant scheduling the PDSCH for the plurality of UEs. In some examples, the DCI has an aggregation level of 8 or 16. In some examples, the BS sends a common or group-common radio network temporary identifier (RNTI) to the plurality of UEs. In some examples, the BS scrambles cyclic redundancy check (CRC) bits of the PDCCH using the RNTI. In some examples, the PDCCH is sent in a common search space. In some examples, the PDCCH indicates the number of resource blocks (RBs) of the transport block and/or the modulation and coding scheme (MCS) of the transport block. In some examples, the BS groups UEs into a plurality of groups based on MCS requirements associated with the UEs, and the plurality of UEs includes one of the plurality of groups of UEs.

In some examples, the PDSCH is an initial transmission or a retransmission. In some examples, the PDSCH is a unicast or broadcast transmission. In some examples, the PDSCH is unicast to the plurality of UEs. In some examples, the PDSCH is an ultra-reliable low-latency communication (URLLC) PDSCH. In some examples, the data includes different data for each of the plurality of UEs. In some examples, a packet conveying the PDSCH includes a medium access control (MAC) header indicating locations of the different data for each of the plurality of UEs. In some examples, the PDSCH is broadcast to the plurality of UEs. In some examples, the PDSCH is point-to-multipoint (PTM) transmission. In some examples, the data comprises common data for the plurality of UEs.

In some examples, the BS concatenates information bits for each of the plurality of UEs in the transport block before encoding the transport block. In some examples, after encoding the transport block, the different data for the plurality of UEs is spread across all RBs in a slot. In some examples, the BS encodes the transport block using superposition coding. In some examples, the BS adds common cyclic redundancy check (CRC) bits to the transport block before the encoding.

In some examples, a packet conveying the PDSCH includes a fixed length header indicating the number of the plurality of UEs. In some examples, the packet includes, for each of the plurality of UEs, another fixed length header addressed to the UE and including a location and/or length of the data associated with the UE. In some examples, a packet conveying the PDSCH includes a header, addressed to the plurality of UEs, before the common data for the plurality of UEs. In some examples, the header is a function of all of the identifiers of the plurality of UEs. In some examples, the BS sends an indication of a length of the header to the plurality of UEs via radio resource control (RRC) signaling.

In some examples, the BS provides an indication to the plurality of UEs of a code rate, transport block size, layer ordering, and/or codebook information via RRC signaling, DCI, and/or one or more lookup tables (LUTs).

Certain aspects provide a method for wireless communication by a UE. The method generally includes receiving a PDCCH scheduling a plurality of UEs for a PDSCH transmission. The UE receives a single transport block with data for the plurality of UEs on the scheduled PDSCH. The UE determines the data in the PDSCH intended for the UE.

In some examples, the PDCCH is a single DCI including a downlink grant scheduling the PDSCH for the plurality of UEs. In some examples, the DCI has an aggregation level of 8 or 16. In some examples, the UE receives a common or group-common RNTI from the BS. In some examples, the UE descrambles CRC bits of the PDCCH using the RNTI. In some examples, the UE monitors a common search space for the PDCCH. In some examples, the PDCCH indicates the number of RBs of the transport block and/or the MCS of the transport block. In some examples, the UE decodes the PDSCH based on the indication. In some examples, the UE sends a negative acknowledgement (NACK) for a previous PDSCH transmission. In some examples, the UE monitors for the PDCCH based on sending the NACK.

In some examples, the PDSCH is an initial transmission or a retransmission. In some examples, the PDSCH is a unicast or broadcast transmission. In some examples, the PDSCH is a unicast transmission. In some examples, the PDSCH is a URLLC PDSCH.

In some examples, the data comprises includes data for each of the plurality of UEs.

In some examples, after decoding the transport block, the different data for the plurality of UEs is spread across all RBs in a slot.

In some examples, a packet conveying the PDSCH includes a MAC header indicating locations of the different data for each of the plurality of UEs. In some examples, the UE determines the data intended for UE is based on the MAC header. In some examples, a packet conveying the PDSCH includes a fixed length header indicating the number of the plurality of UEs. In some examples, the packet includes, for each of the plurality of UEs, another fixed length header addressed to the UE and including a location and/or length of the data associated with the UE. In some examples, the UE determines the data intended for the UE is based on the indicated number of the plurality of UEs, location of the data, and/or length of the data. In some examples, the PDSCH is a PTM broadcast transmission. In some examples, the data includes common data for the plurality of UEs. In some examples, a packet conveying the PDSCH includes a header, addressed to the plurality of UEs, before the common data for the plurality of UEs. In some examples, the UE determines the data intended for the UE by determining the common data based on the header. In some examples, the header is a function of all of the identifiers of the plurality of UEs. In some examples, the UE receiving an indication of a length of the header from the BS via RRC signaling.

In some examples, the UE decodes the transport block using superposition coding. In some examples, the UE receives an indication to from the BS of a code rate, transport block size, layer ordering, and/or codebook information via RRC signaling, DCI, and/or one or more LUTs.

Certain aspects provide an apparatus for wireless communication. The apparatus generally includes means for sending a PDCCH scheduling a plurality of UEs for a PDSCH transmission. The apparatus includes means for sending data for the plurality of UEs in a single transport block on the scheduled PDSCH.

Certain aspects provide an apparatus for wireless communication. The apparatus generally includes means for receiving a PDCCH scheduling a plurality of UEs for a PDSCH transmission. The apparatus includes means for receiving a single transport block with data for the plurality of UEs on the scheduled PDSCH. The apparatus includes means for determining the data in the PDSCH intended for the apparatus.

Certain aspects provide an apparatus for wireless communication. The apparatus generally includes a transmitter configured to send a PDCCH scheduling a plurality of UEs for a PDSCH transmission. The transmitter is further configured to send data for the plurality of UEs in a single transport block on the scheduled PDSCH.

Certain aspects provide an apparatus for wireless communication. The apparatus generally includes a receiver configured to receive a PDCCH scheduling a plurality of UEs for a PDSCH transmission. The receiver is further configured to receive a single transport block with data for the plurality of UEs on the scheduled PDSCH. The apparatus includes at least one processor coupled with a memory and configured to determine the data in the PDSCH intended for the apparatus.

Certain aspects provide a computer readable medium having computer executable code stored thereon for wireless communication. The computer executable code generally includes code for sending a PDCCH scheduling a plurality of UEs for a PDSCH transmission. The computer executable code includes code for sending data for the plurality of UEs in a single transport block on the scheduled PDSCH.

Certain aspects provide a computer readable medium having computer executable code stored thereon for wireless communication by a UE. The computer executable code generally includes code for receiving a PDCCH scheduling a plurality of UEs for a PDSCH transmission. The computer executable code includes code for receiving a single transport block with data for the plurality of UEs on the scheduled PDSCH. The computer executable code includes means for determining the data in the PDSCH intended for the UE.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
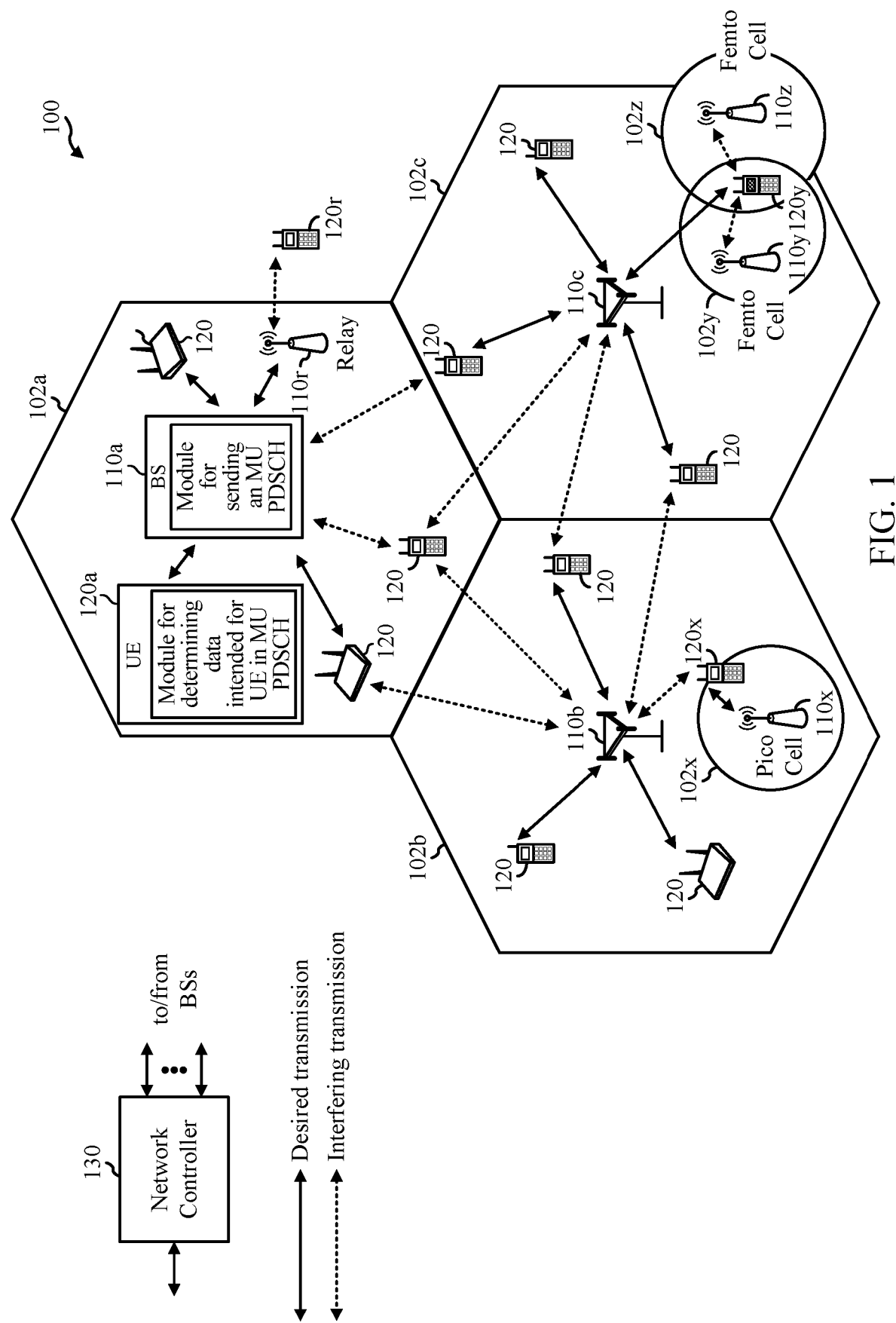
FIG. 1 is a block diagram conceptually illustrating an example telecommunications system, in accordance with certain aspects of the present disclosure.

Aspects of the present disclosure provide apparatus, methods, processing systems, and computer readable mediums for a multi-user (MU) physical downlink shared channel (PDSCH) transmission.

New radio systems (e.g., 5G NR) support various services including ultra-reliable low-latency communication (URLLC). URLLC has stringent reliability and latency requirements. For example, URLLC may target a reliability of a packet error rate (PER) of $10^{-6}$, with a target latency of 0.5 ms to 10 ms.

Retransmission (e.g., hybrid automatic repeat request (HARM) retransmissions) for PDSCH can be done to help achieve the target reliability for URLLC. The number of PDSCH retransmissions, that can be done, however, may be limited due to the low latency targets for URLLC. Also, the physical downlink control channel (PDCCH) carrying the downlink grants for the PDSCH transmissions are also sent with high reliability to meet the reliability target for URLLC.

Accordingly, techniques for sending control information, such as a PDCCH carrying the downlink grants to schedule data transmissions and data retransmissions, such as PDSCH, and techniques for data broadcast, data transmission, and data retransmission, all with high reliability and low latency to meet the URLLC targets, are desirable.

Aspects of the present disclosure provide a multi-user data packet, such as a PDSCH, that multiplexes data for multiple UEs in a single large transport block (TB). The multi-user data packet can be scheduled using a single downlink grant, such as a single PDCCH transmission. The multi-user data packet may have improved reliability due to a larger codeword size and more frequency diversity due to the larger TB size for the multi-user data packet. Certain encoding techniques for the multi-user data packet may increase capacity and further improve the reliability of the multi-user data packet.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra MobileBroadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2).

New radio (NR) access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

The techniques described herein may be used for the wireless networks and radio technologies mentioned above as well as other wireless networks and radio technologies. For clarity, while aspects may be described herein using terminology commonly associated with 3G, 4G, and/or 5G wireless technologies, aspects of the present disclosure can be applied in other generation-based communication systems.

FIG. 1 illustrates an example wireless communication network 100 in which aspects of the present disclosure may be performed. For example, the wireless communication network 100 may be a 5G NR network. The wireless communication network 100 may support URLLC service. A base station (BS), such as a BS 110 in the wireless communication network 100 (which may be a gNB) may schedule multiple user equipment (UE), such as UEs 120 in the wireless communication network 100, for a downlink data broadcast transmission, unicast transmission, or retransmission. In some examples, the BS 110 sends a single downlink control information transmission, such as a PDCCH carrying a downlink control information (DCI) with a downlink grant, scheduling the multiple UEs for the data packet (e.g., an MU PDSCH transmission). The BS 110 then transmits a single packet (e.g., a single transport block (TB)) with data for all of the multiple UEs. As shown in FIG. 1, the BS 110a may have a module for sending an MU PDSCH. The UE 120a can receive the MU PDSCH. The UE 120a has a module for determining data intended for the UE in the MU PDSCH.

As illustrated in FIG. 1, the wireless communication network 100 may include a number of BSs 110 and other network entities. A BS 110 may be a station that communicates with UEs 120. Each BS 110 may provide communication coverage for a particular geographic area. In 3GPP, the term "cell" can refer to a coverage area of a Node B (NB) and/or a NB subsystem serving this coverage area, depending on the context in which the term is used. In NR systems, the term "cell" and next generation NB (gNB or gNodeB), access point (AP), transmission point (TP), or transmission reception point (TRP) may be interchangeable. In some examples, a cell may not necessarily be stationary, and the geographic area of the cell may move according to the location of a mobile BS. In some examples, the BSs may be interconnected to one another and/or to one or more other BSs or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless communication network 100 may be a heterogeneous network that includes BSs of different types, e.g., macro BS, pico BS, femto BS, relays, etc. These different types of BSs may have different transmit power levels, different coverage areas, and different impact on interference in the wireless communication network 100. For example, macro BS may have a high transmit power level (e.g., 20 Watts) whereas pico BS, femto BS, and relays may have a lower transmit power level (e.g., 1 Watt).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless communication network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for system bandwidth of 1.25, 2.5, 5, 10 or 20 MHz, respectively.

NR may utilize OFDM with a CP on the uplink and downlink and include support for half-duplex operation using TDD. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells.

In some examples, access to the air interface may be scheduled, wherein a. A scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

Figure 2:
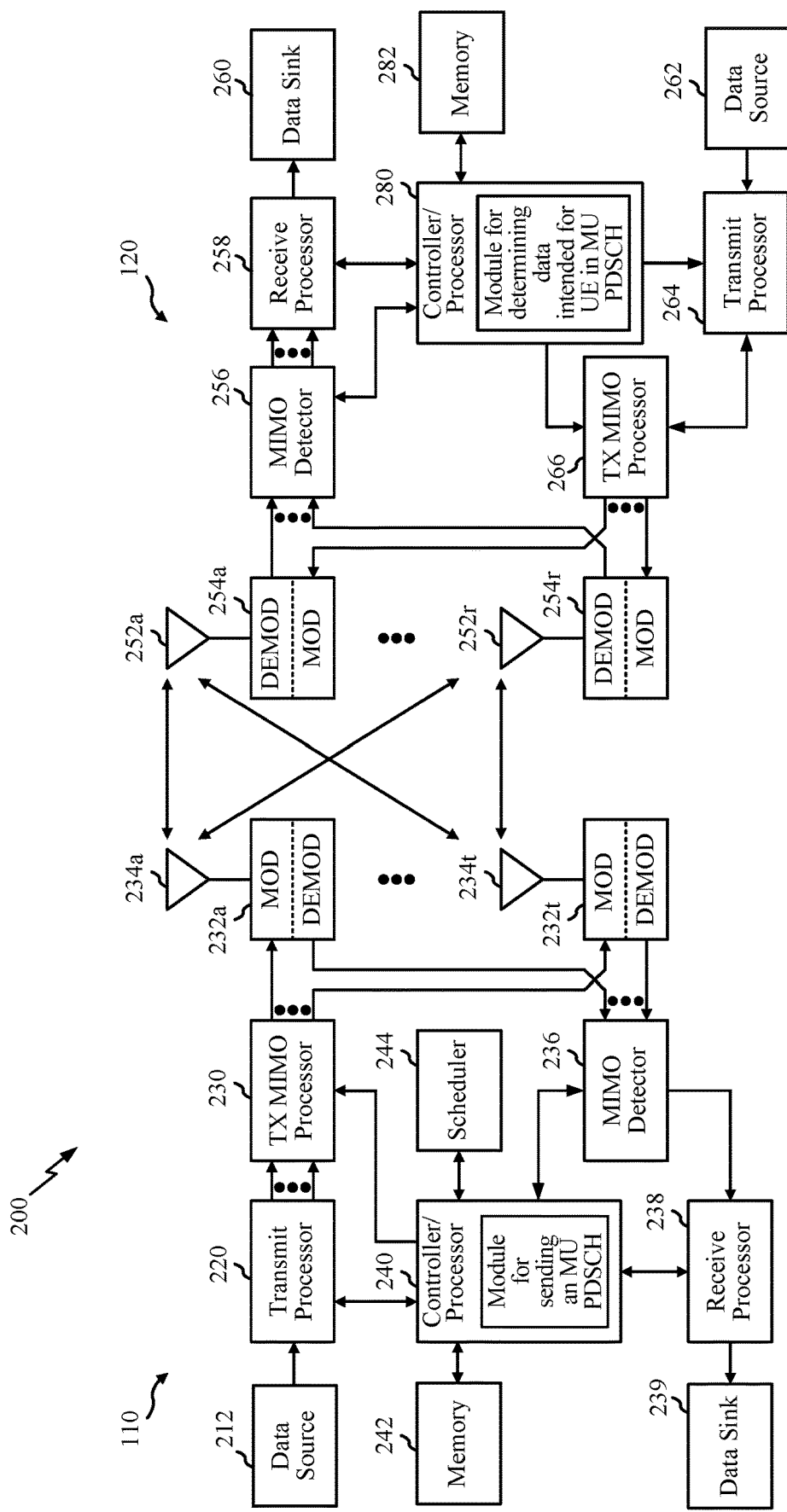
FIG. 2 is a block diagram illustrating an example logical architecture of a distributed radio access network (RAN), in accordance with certain aspects of the present disclosure.

FIG. 2 illustrates example components of BS 110 and UE 120 (as depicted in FIG. 1), which may be used to implement aspects of the present disclosure.

At the BS 110, a transmit processor 220 may receive data from a data source 212 and control information from a controller/processor 240. The control information may be for the physical broadcast channel (PBCH), physical control format indicator channel (PCFICH), physical hybrid ARQ indicator channel (PHICH), PDCCH, group common PDCCH (GC PDCCH), etc. The data may be for the PDSCH, etc. The processor 220 may process (e.g., encode and symbol map) the data and control information to obtain data symbols and control symbols, respectively. The processor 220 may also generate reference symbols, e.g., for the primary synchronization signal (PSS), secondary synchronization signal (SSS), and cell-specific reference signal (CRS). A transmit (TX) multiple-input multiple-output (MIMO) processor 230 may perform spatial processing (e.g., precoding) on the data symbols, the control symbols, and/or the reference symbols, if applicable, and may provide output symbol streams to the modulators (MODs) 232a through 232t. Each modulator 232 may process a respective output symbol stream (e.g., for OFDM, etc.) to obtain an output sample stream. Each modulator may further process (e.g., convert to analog, amplify, filter, and upconvert) the output sample stream to obtain a downlink signal. Downlink signals from modulators 232a through 232t may be transmitted via the antennas 234a through 234t, respectively. As shown in FIG. 2, the controller/processor 240 of the BS 110 includes a module for sending an MU PDSCH. Although shown in the controller/processor 240, other components of the BS 110 may be used for sending an MU PDSCH. For example, the scheduler 244, the memory 242, data source 212, transmit processor 220, TX MIMO processor 230, modulator(s) 232a-232t, and/or antenna(s) 234a-234t may be configured to perform the MU PDSCH transmission. In addition, the components of the BS 110 may be used to send a PDCCH scheduling the MU PDSCH transmission.

At the UE 120, the antennas 252a through 252r may receive the downlink signals from the BS 110 and may provide received signals to the demodulators (DEMODs) in transceivers 254a through 254r, respectively. Each demodulator 254 may condition (e.g., filter, amplify, downconvert, and digitize) a respective received signal to obtain input samples. Each demodulator may further process the input samples (e.g., for OFDM, etc.) to obtain received symbols. A MIMO detector 256 may obtain received symbols from all the demodulators 254a through 254r, perform MIMO detection on the received symbols if applicable, and provide detected symbols. A receive processor 258 may process (e.g., demodulate, deinterleave, and decode) the detected symbols, provide decoded data for the UE 120 to a data sink 260, and provide decoded control information to a controller/processor 280. As shown in FIG. 2, the controller/processor 280 of the UE 120 includes a module for determining data intended for the UE 120 in an MU PDSCH. Although shown in the controller/processor 280, other components of the UE 110 may be used for determining the data intended for the UE 120 in the MU PDSCH, such as the receive processor 258. In addition, the data sink 260, receive processor 258, controller/processor 280, MIMO processor 256, demodulator(s) 254a-254t, and/or antenna(s) 252a-252t may be configured to receive PDCCH scheduling the MU PDSCH transmission and/or to receive the MU PDSCH transmission.

On the uplink, at UE 120, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., for the sounding reference signal (SRS)). The symbols from the transmit processor 264 may be precoded by a TX MIMO processor 266 if applicable, further processed by the demodulators in transceivers 254a through 254r (e.g., for SC-FDM, etc.), and transmitted to the BS 110. At the BS 110, the uplink signals from the UE 120 may be received by the antennas 234, processed by the modulators 232, detected by a MIMO detector 236 if applicable, and further processed by a receive processor 238 to obtain decoded data and control information sent by the UE 120. The receive processor 238 may provide the decoded data to a data sink 239 and the decoded control information to the controller/processor 240.

Figure 3:
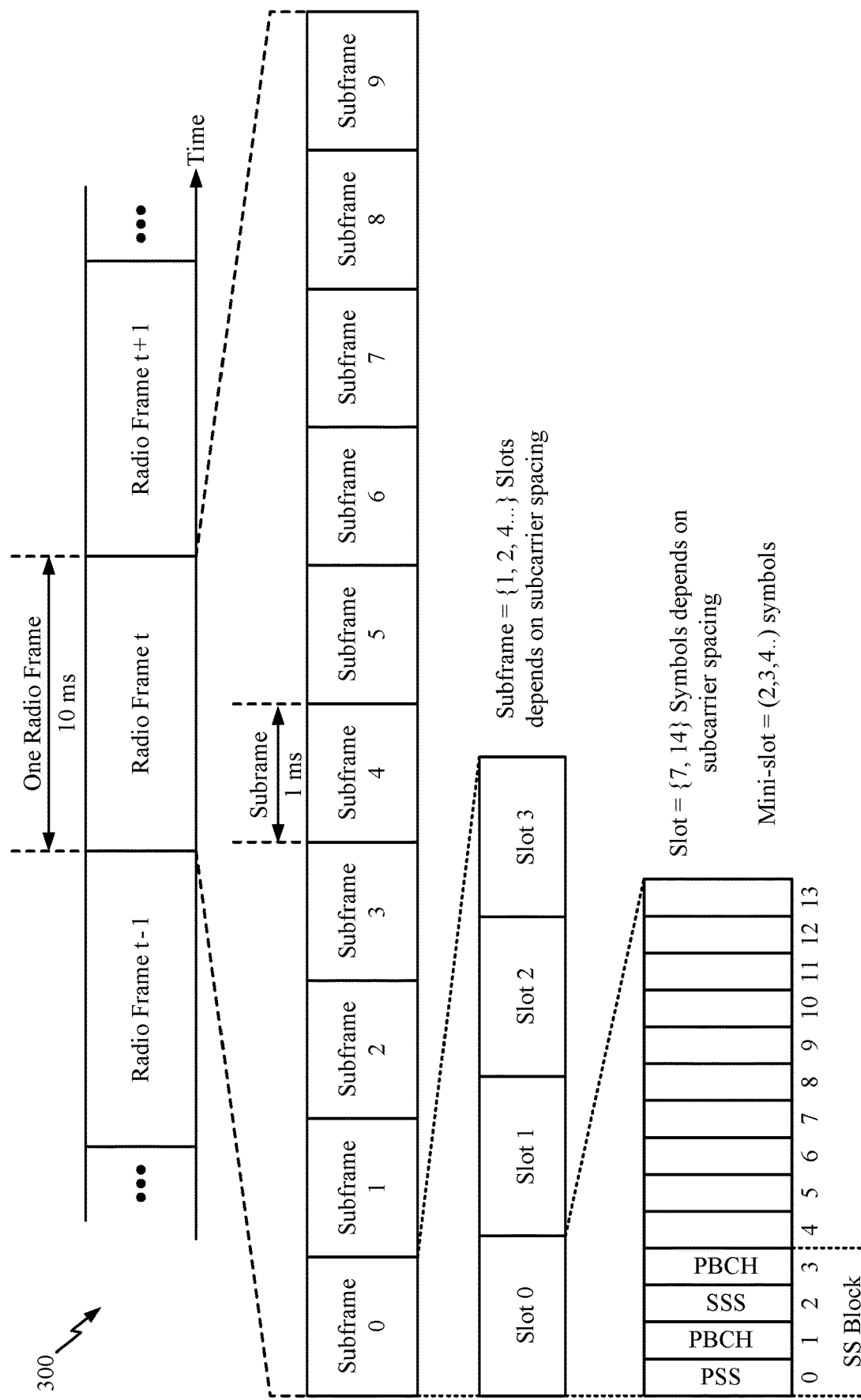
FIG. 3 illustrates an example of a frame format for a new radio (NR) system, in accordance with certain aspects of the present disclosure.

FIG. 3 is a diagram showing an example of a frame format 300 for NR. The transmission timeline for each of the downlink and uplink may be partitioned into units of radio frames. Each radio frame may have a predetermined duration (e.g., 10 ms) and may be partitioned into 10 subframes, each of 1 ms, with indices of 0 through 9. In NR, the basic transmission time interval (TTI) is referred to as a slot. Each subframe may include a variable number of slots (e.g., 1, 2, 4, 8, 16, ... slots) depending on the subcarrier spacing (e.g., 15 KHz, 30 kHz, 60 kHz, 120 kHz, 240 kHz, etc.). Each slot may include a variable number of symbol periods (e.g., 7 or 14 symbols) depending on the subcarrier spacing (SCS). The symbol periods in each slot may be assigned indices. A mini-slot is a subslot structure (e.g., 2, 3, or 4 symbols). Cyclic prefix (CP) length may also depend on the SCS. The NR RB is 12 consecutive frequency subcarriers. Each symbol in a slot may have a link direction (e.g., DL, UL, or flexible) for data transmission and the link direction for each subframe may be dynamically switched. The link directions may be based on the slot format. Each slot may include DL/UL data as well as DL/UL control information.

As mentioned above, PDSCH retransmission may be done help achieve the target reliability for URLLC, but may be limited due to the low latency targets for URLLC. In addition, PDCCH carrying downlink grants for the PDSCH (re)transmissions have high reliability targets, and semi-persistent scheduling (or configured scheduling) may only be applicable to the first (e.g., initial) transmission.

Accordingly, techniques for scheduling data transmissions and retransmissions, as well as techniques for transmitting (or broadcasting) the data, all with high reliability and low latency (e.g., to meet the URLLC targets), are desirable.

Example Multi-User Data Packet

Aspects of the present disclosure provide a multi-user data packet. The multi-user data packet can be a multi-user physical downlink shared channel (PDSCH) transmission. The multi-user packet multiplexes data for multiple UEs in a single large transport block (TB). The multi-user packet can be scheduled using a single control channel transmission. For example, the multi-user packet can be scheduled with a downlink control information (DCI), carrying a grant, on the physical downlink control channel (PDCCH). Because a single control channel transmission is used, higher aggregation levels can be used for the DCI (e.g., an aggregation level of 8 or 16). The multi-user data packet may have improved reliability due to a larger codeword size. The multi-user data packet may have improved frequency diversity due to the larger TB size for the multi-user data packet. Certain encoding techniques for the multi-PDSCH may increase capacity and further improve the reliability of the multi-user PDSCH.

Figure 4:
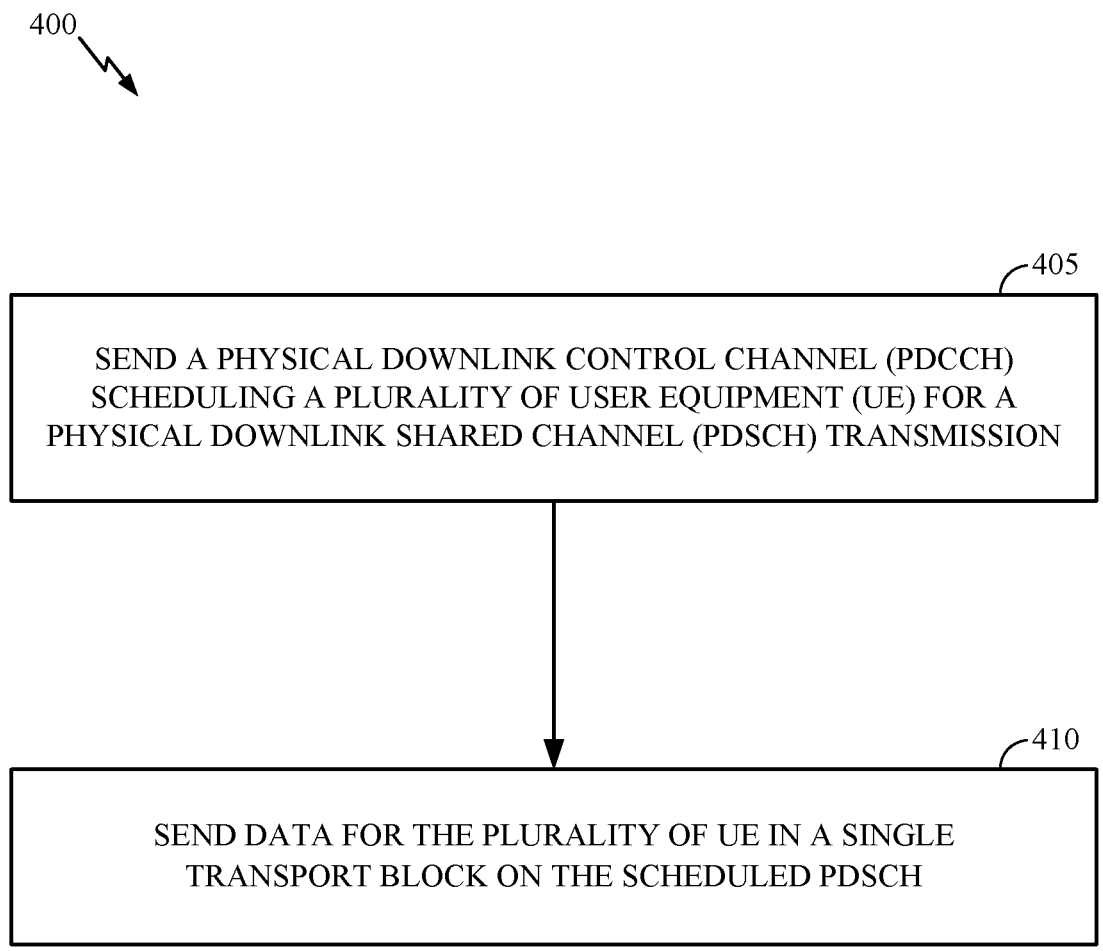
FIG. 4 is a flow diagram illustrating example operations by a BS for a multi-user data packet, such as a physical downlink shared channel (PDSCH), in accordance with certain aspects of the present disclosure.

FIG. 4 is a flow diagram illustrating example operations 400 for a multi-user data packet, such as a PDSCH, in accordance with certain aspects of the present disclosure. The operations 400 may be performed, for example, by a BS (e.g., a BS 110 in the wireless communication network 100). Operations 400 may be implemented as software components that are executed and run on one or more processors (e.g., controller/processor 240 of FIG. 2). Further, the transmission and reception of signals by the BS in operations 400 may be enabled, for example, by one or more antennas (e.g., antennas 234 of FIG. 2). In certain aspects, the transmission and/or reception of signals by the BS may be implemented via a bus interface of one or more processors (e.g., controller/processor 240) obtaining and/or outputting signals.

The operations 400 begin, at 405, by sending a control channel (e.g., PDCCH) scheduling a plurality of UEs for a data packet (e.g., PDSCH) transmission. The control channel may contain DCI including a downlink grant scheduling the data packet for the plurality of UEs. In some examples, the DCI may have an aggregation level of 8 or 16. The aggregation level may correspond to a number control channel elements (CCEs) used for the DCI transmission.

At 410, the BS sends data for the plurality of UEs in a single transport block on the scheduled data packet (e.g., PDSCH). The data packet may be an initial transmission or a retransmission (e.g., a hybrid automatic repeat request (HARD) retransmission). The data packet may be unicast or broadcast.

In the case of a retransmission, the plurality of UEs may include only UEs that need a transmission. For example, the BS may retransmit data, in the multi-user data packet, for UEs from which the BS received a negative acknowledgement (NACK), or failed to receive an ACK from, for a previous transmission of the data. The BS may send a single DCI scheduling the plurality of UEs. In this case, only the UEs that require retransmission (e.g., that sent a NACK or did not send ACK) may monitor for the type of grant in the DCI. A common search may be used for the control channel (e.g., common PDCCH search space). The BS may use a radio network temporary identifier (RNTI) to scramble the cyclic redundancy check (CRC) bits. The BS may add the CRC bits before encoding the transport block. The RNTI may be a common or group-common RNTI. The BS may signal the RNTI to the UEs, for example, via radio resource control (RRC) signaling. UEs that fail to decode the first transmission (e.g., the previous PDSCH transmission) may try to decode for the specific RNTI, while UEs that succeeded in the first transmission may not monitor for or try to decode that RNTI. In some examples, a medium access control (MAC) header within the transport block for the MU data packet can be used by individual UEs to demarcate their packets After decoding the control channel, the UEs would know enough information, such as the number of resource blocks (RBs) and/or the modulation coding scheme (MCS), to decode the corresponding consolidated data packet. In some examples, the number of RBs may be known to the UE beforehand and only the MCS may be signaled to the UE in the control channel. In this case, the MCS may scale with respect to the number UEs to be served. In some example, the BS may group UEs into a plurality of groups. The BS may schedule the different groups with different control channel and each group receives its own MU data packet. The BS may group the UEs according to UEs with similar MCS requirements.

According to certain aspects, the BS unicasts the MU data packet (e.g., PDSCH) with different data for the plurality of UEs. In some examples, the data packet is for URLLC.

In some examples, the BS generates the MU data packet similar to a format used for the random access response (RAR) message (e.g., MSG2 in LTE and/or NR random access procedure). The BS may concatenate information bits for each of the plurality of UEs in the transport block before encoding the transport block. The different data for the plurality of UEs in the transport block may be frequency division multiplexed (FDMed). For example the information bits may be concatenated in the transport block before encoding the transport block. After encoding (e.g., joint encoding and modulation) the transport block, the different data for the plurality of UEs may be spread across all RBs in a slot.

Figure 5:
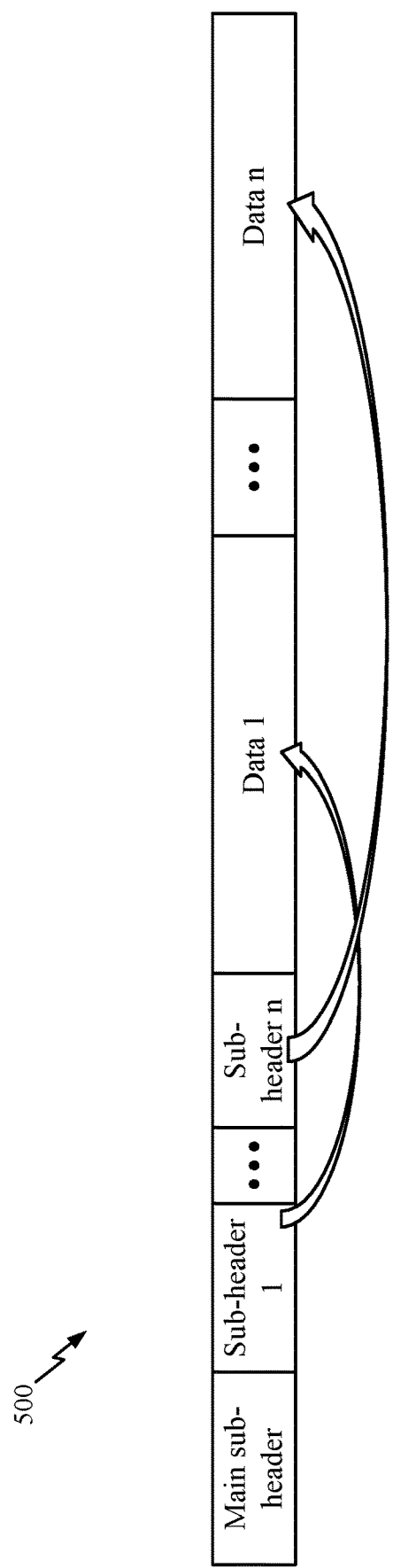
FIG. 5 is an example format for a multi-user data packet, in accordance with certain aspects of the present disclosure.

FIG. 5 is an example format for a multi-user data packet 500 (e.g., PDSCH), in accordance with certain aspects of the present disclosure. As shown in FIG. 5, the multi-user data packet 500 format may include a MAC header indicating locations of the different data for each of the plurality of UEs. The MAC header may be at the beginning of the packet. The MAC header may include a fixed length header indicating the number, n, of the plurality of UEs (e.g., the Main sub-header in FIG. 5). The MAC header may include other fixed length headers (e.g., Sub-headers 1-n in FIG. 5) addressed to each of the UE and including an address (e.g., C-RNTI) location and/or packet length of the data associated with the UE (e.g., if the packet-lengths are non-uniform) pointing to the data (e.g., Data 1 . . . n for that the UE in the multi-user data packet 500.

Figure 6A:
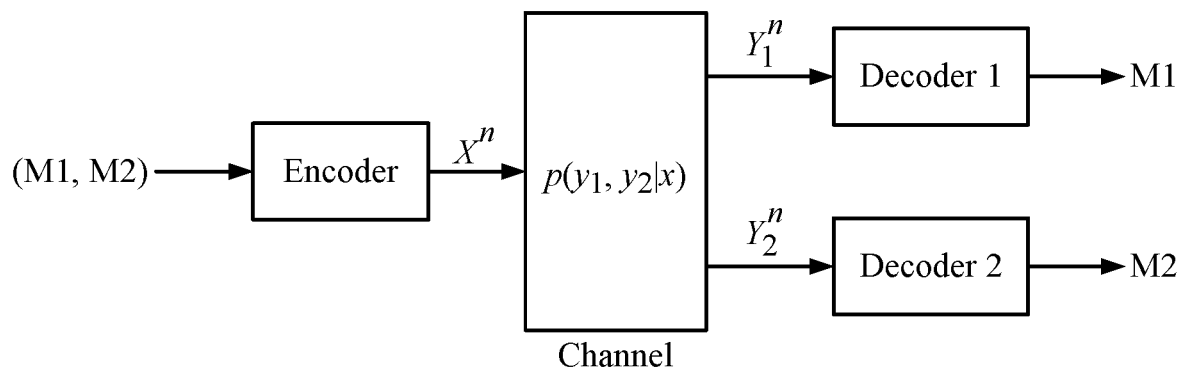
FIGS. 6A-B illustrate an example encoding for a multi-user data packet, in accordance with certain aspects of the present disclosure.
Figure 6B:
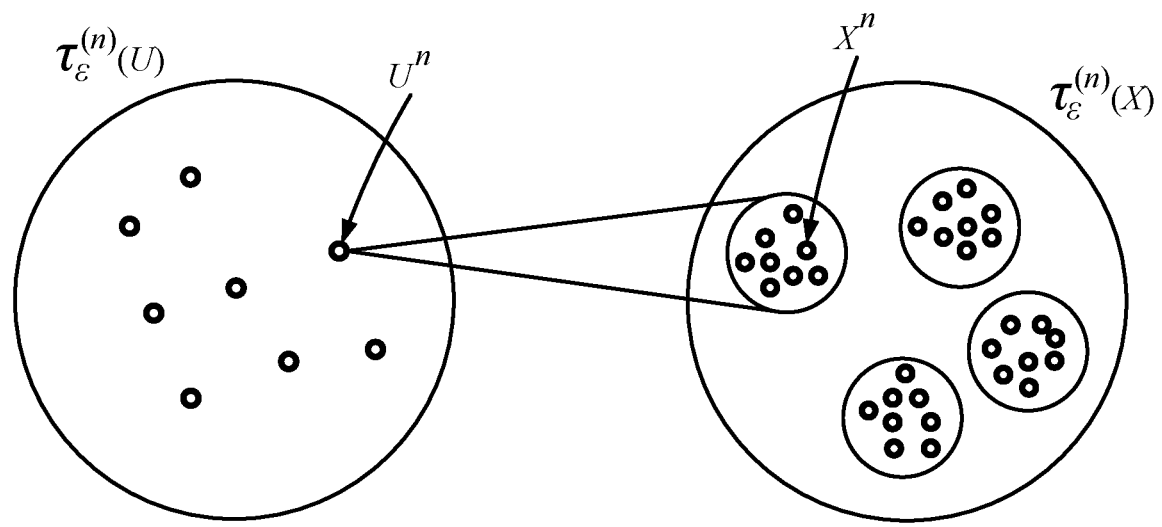

According to certain aspects, the BS may use superposition coding for the MU data packet, for example, as shown in FIGS. 6A-B. A more detailed discussion of superposition coding may be found, for example, in the book titled, "IEEE Trans. Inf. Theory", vol. 18, no. 1, pp. 2-14, January 1972; "Comments on broadcast channels" IEEE Transactions on information theory 44.6 (1998); pp. 2524-2530, "Lecture notes on network information theory" by El Gamal, Abbas, and Young-Han Kim. Superposition coding uses the concept of coding used for broadcast channels (e.g., referred to as dirty-paper coding techniques). The superposition coding/binning technique may generally include a simplified communication model M1 is used for information bits for the first user, and model M2 is used for information bits for the second user, etc. The different models may correspond to different coding rates R1 and R2 for the two users. As shown in FIG. 6A, two-layer encoding may be used. In the first encoding layer, a codebook U (corresponding to M2, R2) is generated (i.e., referred to as the "cloud center"). In the second encoding layer, conditional on U, another codebook X (corresponding to M1, R1) is generated (e.g., referred to as the "satellite"), for example, as shown in FIG. 6B. On the decoding side, decoder 2 (e.g., user 2) decodes the "cloud center" and Decoder 1 (e.g., user 1) decodes the "satellite". This can achieve larger capacity than concatenation technique describe above, allows different code rates, and may eliminate the need for a sub-header in the packet.

The BS may provide additional information (e.g., in addition the number of RBs and MCS) to the UE when superposition coding is used. For example, the BS may provide an indication to the plurality of UEs of a code rate, transport block size (TBS), layer ordering, or codebook information via RRC signaling, DCI, and/or one or more lookup tables (LUTs). A common CRC can be included before encoding (CRC, M1, M2, . . . ) where it is decoded by all users.

According to certain aspects, the BS broadcasts the MU data packet (e.g., PDSCH) containing broadcast data, common to all of the plurality of UEs. The PDSCH may be a point-to-multipoint (PTM) transmission. In some cases, the users may be in a same geographical area. In some examples, broadcast data may be useful for cases including, but not limited to, public safety broadcasts, address discovery, commercial broadcasts (e.g., top videos, popular apps downloads, mobile advertising), etc.

The BS may send DCI with a specific group-common RNTI. The DCI may indicate the number of RBs and/or the MCS for the MU data packet. The DCI may be sent in a common control channel (e.g., PDCCH) search space. The RNTI may not identify group RNTI, or in other words, the group-common RNTI does not need to exactly determine the set of users for which the data is intended for. Further clarification of the intended set of users can be provided in a header of the MU data packet as shown in the example MU data packet format 700 illustrated in FIG. 7.

Figure 7:
FIG. 7 another example format for a multi-user data packet, in accordance with certain aspects of the present disclosure.

As shown in FIG. 7, the MU data packet format 700 may include a header (or headers) at the beginning of the common data (e.g., on PDSCH) so that each UE can uniquely identify if the message is addressed to it. The header may be similar to the Main-header, described above with respect to FIG. 5, for the unicast MU data packet format 500. The header may contain multiple sub-headers, each with fixed length to indicate the number UEs and C-RNTI of each UE. In some examples, the header is a function of all of the identifiers of the plurality of UEs. For example, the header may be a function of the C-RNTIs of the plurality of UEs. This may reduce overhead for the packet. The BS may signal the length of the header via RRC signaling.

The techniques described herein for the MU data packet with broadcast data may allow flexible grouping, scheduling, and HARQ operation.

Figure 8:
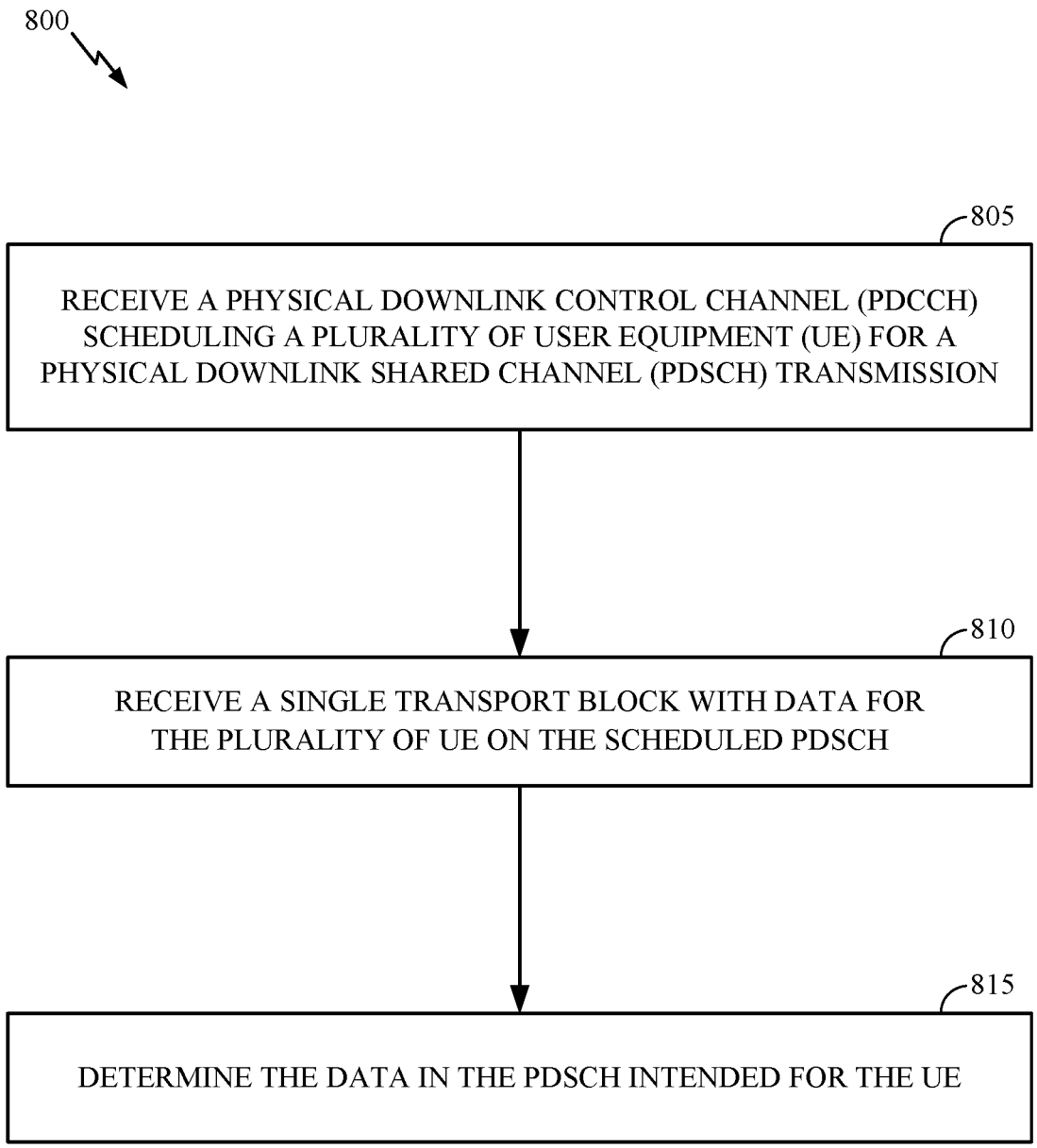
FIG. 8 is a flow diagram illustrating example operations by a UE for a multi-user PDSCH, in accordance with certain aspects of the present disclosure.

FIG. 8 is a flow diagram illustrating example operations 800 for a multi-user data packet (e.g., MU PDSCH), in accordance with certain aspects of the present disclosure. The operations 800 may be performed, for example, by a UE (e.g., such as a UE 120 in the wireless communication network 100). The operations 800 may be complimentary operations by the UE to the operations 400 performed by the BS. Operations 800 may be implemented as software components that are executed and run on one or more processors (e.g., controller/processor 280 of FIG. 2). Further, the transmission and reception of signals by the UE in operations 800 may be enabled, for example, by one or more antennas (e.g., antennas 252 of FIG. 2). In certain aspects, the transmission and/or reception of signals by the UE may be implemented via a bus interface of one or more processors (e.g., controller/processor 280) obtaining and/or outputting signals.

The operations 800 may begin, at 805, by receiving a control channel (e.g., PDCCH) scheduling a plurality of UEs for a data packet (e.g., PDSCH) transmission. In some examples, the UE sends a NACK for a previous transmission (e.g., a previous transmission of the data packet), and monitors for the control channel based on sending the NACK (or not sending an ACK). If the UE sends an ACK, the UE may not monitor for the control channel. The UE may monitor a common search space for the control channel. The UE may receive (e.g., via RRC) an indication of an RNTI from the BS and the UE may use the signaled RNTI to monitor the control channel. The UE determines information from the control channel to decode the data packet (e.g., number of RBs, MCS, etc.) and/or from information (e.g., number of RBs) received via RRC.

At 810, the UE receives a single transport block with data for the plurality of UEs on the scheduled data packet (e.g., an MU PDSCH). The data packet may be an initial transmission or a retransmission. The data packet may have specific unicast data or common broadcast data for the UE. The data packet may be a URLLC data packet or PTM data packet. The UE decodes the data packet (e.g., or a header of the data packet).

At 815, the UE determines the data in the data packet intended for the UE. For example, the UE can determine the data intended for it based on a header in the data packet as described above with respect to FIG. 5 and/or FIG. 7.

Figure 9:
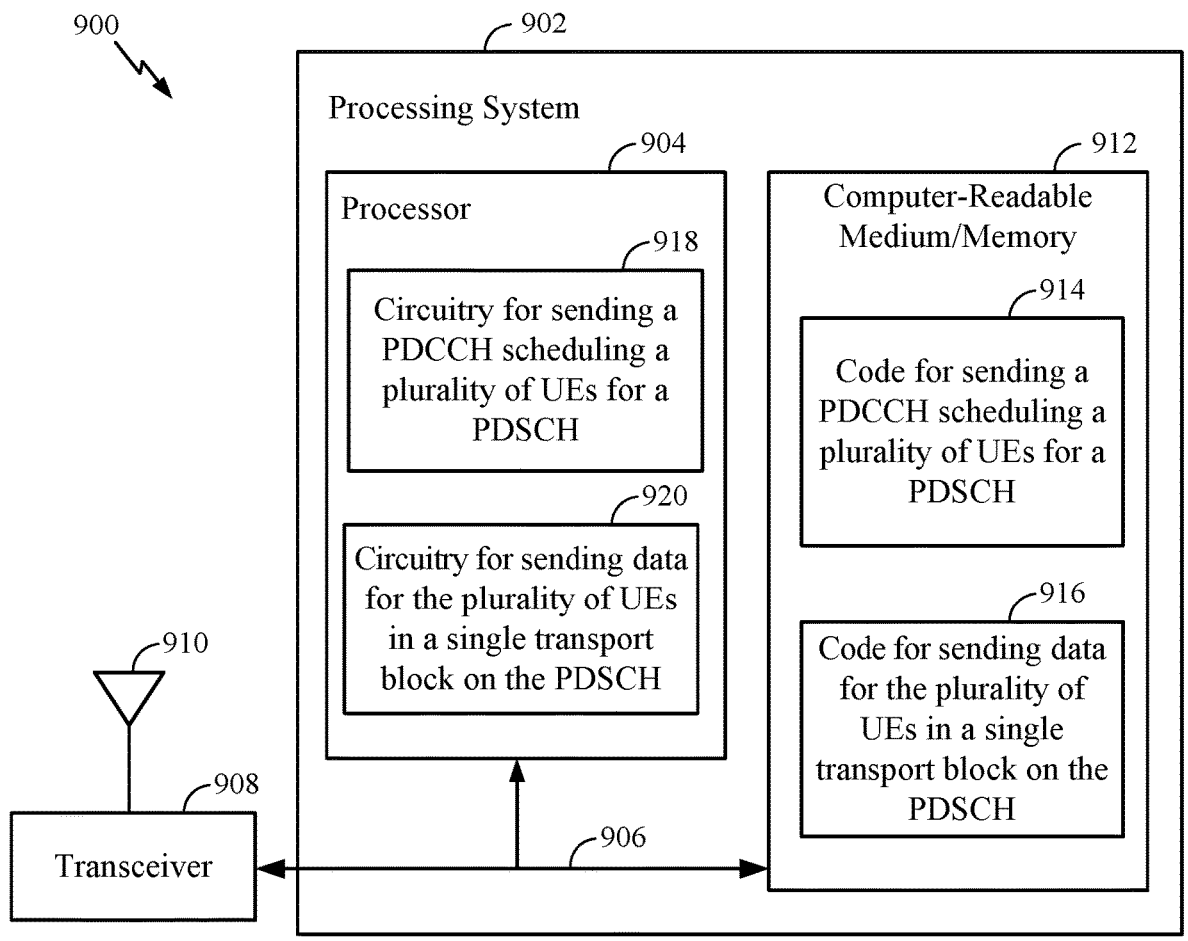
FIG. 9 illustrates a communications device that may include various components configured to perform operations for the techniques disclosed herein in accordance with aspects of the present disclosure.

FIG. 9 illustrates a communications device 900 that may include various components (e.g., corresponding to means-plus-function components) configured to perform operations for the techniques disclosed herein, such as the operations illustrated in FIG. 4. The communications device 900 includes a processing system 902 coupled to a transceiver 908. The transceiver 908 is configured to transmit and receive signals for the communications device 900 via an antenna 910, such as the various signals as described herein. The processing system 902 may be configured to perform processing functions for the communications device 900, including processing signals received and/or to be transmitted by the communications device 900.

The processing system 902 includes a processor 904 coupled to a computer-readable medium/memory 912 via a bus 906. In certain aspects, the computer-readable medium/memory 912 is configured to store instructions (e.g., computer executable code) that when executed by the processor 904, cause the processor 904 to perform the operations illustrated in FIG. 4, or other operations for performing the various techniques discussed herein for sending a multi-user data packet (e.g., PDSCH). In certain aspects, computer-readable medium/memory 912 stores code 914 for sending a control channel (e.g., PDCCH) scheduling a plurality of UEs for a data packet (e.g., PDSCH) and code 916 for sending data for the plurality of UEs in a single transport block on the data packet. In certain aspects, the processor 904 has circuitry configured to implement the code stored in the computer-readable medium/memory 912. The processor 904 includes circuitry 918 for sending a control channel (e.g., PDCCH) scheduling a plurality of UEs for a data packet (e.g., PDSCH) and circuitry 920 for sending data for the plurality of UEs in a single transport block on the data packet.

Figure 10:
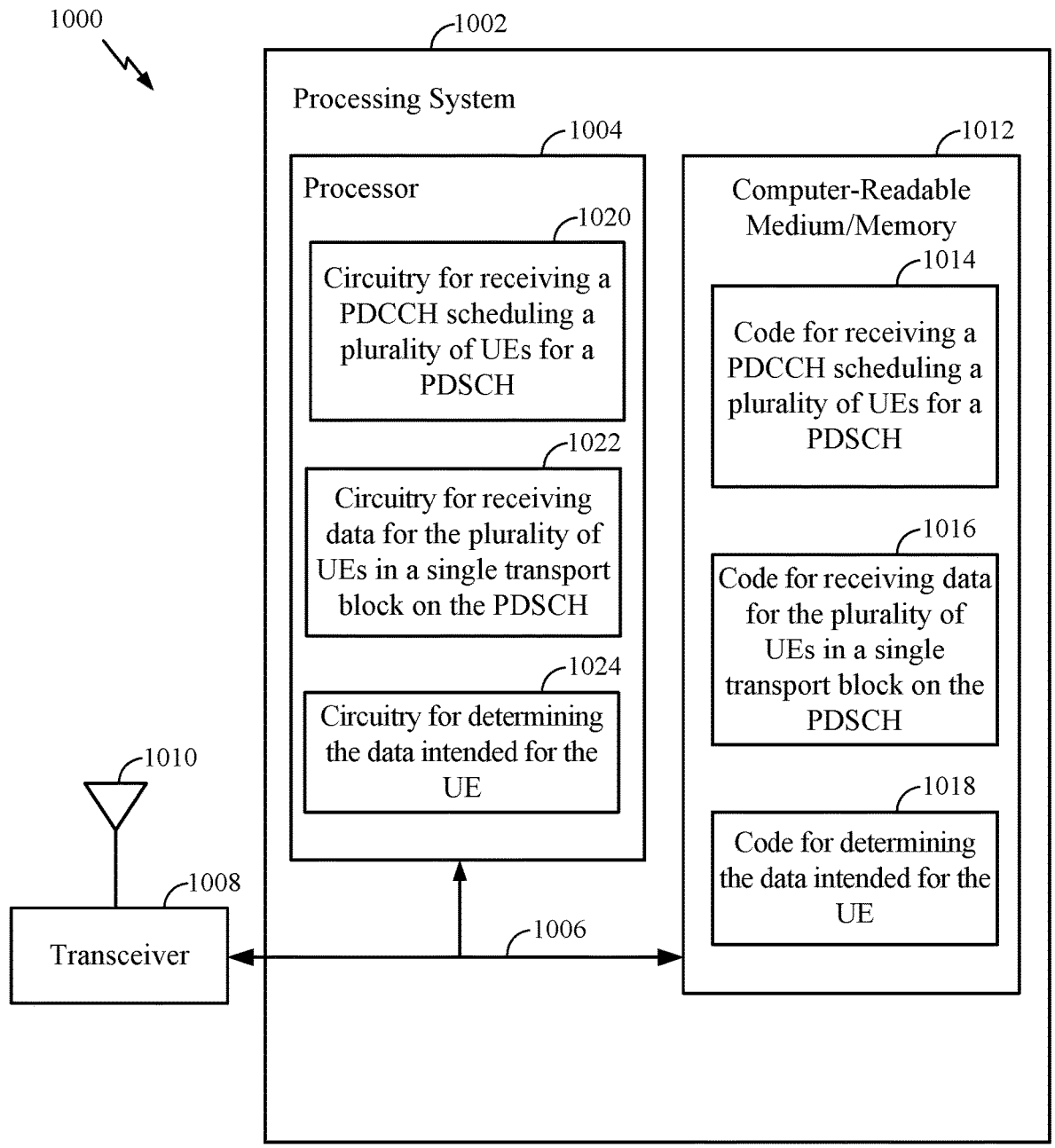
FIG. 10 illustrates a communications device that may include various components configured to perform operations for the techniques disclosed herein in accordance with aspects of the present disclosure.

FIG. 10 illustrates a communications device 1000 that may include various components (e.g., corresponding to means-plus-function components) configured to perform operations for the techniques disclosed herein, such as the operations illustrated in FIG. 8. The communications device 1000 includes a processing system 1002 coupled to a transceiver 1008. The transceiver 1008 is configured to transmit and receive signals for the communications device 1000 via an antenna 1010, such as the various signals as described herein. The processing system 1002 may be configured to perform processing functions for the communications device 1000, including processing signals received and/or to be transmitted by the communications device 1000.

The processing system 1002 includes a processor 1004 coupled to a computer-readable medium/memory 1012 via a bus 1006. In certain aspects, the computer-readable medium/memory 1012 is configured to store instructions (e.g., computer executable code) that when executed by the processor 1004, cause the processor 1004 to perform the operations illustrated in FIG. 8, or other operations for performing the various techniques discussed herein for receiving data in a multi-user data packet (e.g., PDSCH). In certain aspects, computer-readable medium/memory 1012 stores code 1014 for receiving a control channel (e.g., PDCCH) scheduling a plurality of UEs for a data packet (e.g., PDSCH); code 1016 for receiving data for the plurality of UEs in a single transport block on the data packet; and code 1018 for determining the data intended for the UE. In certain aspects, the processor 1004 has circuitry configured to implement the code stored in the computer-readable medium/memory 1012. The processor 1004 includes circuitry 1020 receiving a control channel (e.g., PDCCH) scheduling a plurality of UEs for a data packet (e.g., PDSCH); circuitry 1022 for receiving data for the plurality of UEs in a single transport block on the data packet; and circuitry 1024 for determining the data intended for the UE.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations described herein and illustrated in FIG. 4 and FIG. 8.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for wireless communications by a user equipment (UE), comprising:
    receiving a downlink grant on a physical downlink control channel (PDCCH), wherein the downlink grant schedules a physical downlink shared channel (PDSCH) transmission for a plurality of UEs;
    receiving the PDSCH transmission, wherein the PDSCH transmission includes a single transport block with data for the plurality of UEs;
    determining at least a portion of the data in the PDSCH transmission that is intended for the UE;
    sending a negative acknowledgement (NACK) for a previous PDSCH transmission; and
    monitoring for the PDCCH based on sending the NACK.

2. The method of claim 1, wherein the PDSCH transmission comprises an initial transmission or a retransmission.

3. The method of claim 1, wherein:
    the PDCCH carries a single downlink control information (DCI) including the downlink grant scheduling the PDSCH transmission for the plurality of UEs; and
    the DCI has an aggregation level of 8 or 16.

4. The method of claim 1, further comprising:
    receiving a common or group-common radio network temporary identifier (RNTI); and
    descrambling cyclic redundancy check (CRC) bits of the PDCCH using the RNTI.

5. The method of claim 1, further comprising:
    decoding the single transport block, wherein after decoding the single transport block, the data for the plurality of UEs is spread across all resource blocks (RBs) in a slot.

6. The method of claim 1, wherein the PDSCH transmission comprises a unicast transmission or a broadcast transmission.

7. The method of claim 1, wherein:
    the PDSCH transmission is a unicast ultra-reliable low-latency communication (URLLC) transmission.

8. The method of claim 1, wherein the data comprises different data for each of the plurality of UEs.

9. The method of claim 8, wherein:
    the PDSCH transmission includes a medium access control (MAC) header indicating locations of the different data for each of the plurality of UEs; and
    determining the at least the portion of the data in the PDSCH transmission that is intended for the UE based on the MAC header.

10. The method of claim 8, further comprising monitoring a common search space for the downlink grant on the PDCCH.

11. The method of claim 8, wherein:
    the downlink grant indicates at least one of: the number of resource blocks (RBs) of the single transport block or the modulation and coding scheme (MCS) of the single transport block; and
    decoding the PDSCH transmission based on the indication.

12. The method of claim 8, wherein:
    the PDSCH transmission includes a fixed length packet header indicating a number of the plurality of UEs;
    the PDSCH transmission includes, for each of the plurality of UEs, another fixed length packet header addressed to the UE and including at least one of: a location or a length of the data associated with the UE; and
    determining the at least the portion of the data in the PDSCH transmission that is intended for the UE is based on at least one of: the number of the plurality of UEs, the location of the data, or the length of the data.

13. The method of claim 8, further comprising decoding the single transport block using superposition coding.

14. The method of claim 13, further comprising receiving an indication to of at least one of: a code rate, a transport block size, a layer ordering, or codebook information via at least one of: radio resource control (RRC) signaling, downlink control information (DCI), or one or more lookup tables (LUTs).

15. The method of claim 6, wherein the PDSCH transmission is a point-to-multipoint (PTM) broadcast transmission.

16. The method of claim 15, wherein the data comprises common data for the plurality of UEs.

17. The method of claim 16, wherein:
    the PDSCH transmission includes a packet header, addressed to the plurality of UEs, before the common data for the plurality of UEs; and
    determining the at least the portion of the data in the PDSCH transmission that is intended for the UE comprises determining the common data based on the packet header.

18. The method of claim 17, wherein the packet header is a function of all identifiers of the plurality of UEs.

19. The method of claim 17, further comprising receiving an indication of a length of the packet header via radio resource control (RRC) signaling.

20. An apparatus for wireless communications, comprising:
- means for receiving a downlink grant on a physical downlink control channel (PDCCH), wherein the downlink grant schedules a physical downlink shared channel (PDSCH) transmission for a plurality of apparatuses;
- means for receiving the PDSCH transmission, wherein the PDSCH transmission includes a single transport block with data for the plurality of apparatuses;
- means for determining at least a portion of the data in the PDSCH transmission that is intended for the apparatus;
- sending a negative acknowledgement (NACK) for a previous PDSCH transmission; and
- monitoring for the PDCCH based on sending the NACK.

21. The apparatus of claim 20, wherein:
- the PDCCH carries a single downlink control information (DCI) including the downlink grant scheduling the PDSCH transmission for the plurality of apparatuses; and
- the DCI has an aggregation level of 8 or 16.

22. The apparatus of claim 20, wherein the data comprises different data for each of the plurality of apparatuses.

23. The apparatus of claim 22, wherein:
- the PDSCH transmission includes a medium access control (MAC) header indicating locations of the different data for each of the plurality of apparatuses; and
- determining the at least the portion of the data in the PDSCH transmission that is intended for the apparatus is based on the MAC header.

24. The apparatus of claim 20, wherein the data comprises common data for the plurality of apparatuses.

25. The apparatus of claim 24, wherein:
- the PDSCH transmission includes a packet header, addressed to the plurality of UEs, before the common data for the plurality of apparatuses; and
- determining the at least the portion of the data in the PDSCH transmission that is intended for the apparatus comprises determining the common data based on the packet header.

26. An apparatus for wireless communications, comprising:
- a receiver configured to:
  - receiving a downlink grant on a physical downlink control channel (PDCCH), wherein the downlink grant schedules a physical downlink shared channel (PDSCH) transmission for a plurality of apparatuses;
  - receiving the PDSCH transmission, wherein the PDSCH transmission includes a single transport block with data for the plurality of apparatuses;
- at least one processor coupled with a memory and configured to determine at least a portion of the data in the PDSCH transmission that is intended for the apparatus;
- sending a negative acknowledgement (NACK) for a previous PDSCH transmission; and
- monitoring for the PDCCH based on sending the NACK.

27. The apparatus of claim 26, wherein the data comprises different data for each of the plurality of apparatuses.

28. The apparatus of claim 27, wherein:
- the PDSCH transmission includes a medium access control (MAC) header indicating locations of the different data for each of the plurality of apparatuses; and
- the at least one processor is configured to determine the at least the portion of the data in the PDSCH transmission that is intended for the apparatus based on the MAC header.

29. A non-transitory computer readable medium having computer executable code stored thereon for wireless communications by user equipment (UE), comprising:
- code for receiving a downlink grant on a physical downlink control channel (PDCCH), wherein the downlink grant schedules a physical downlink shared channel (PDSCH) transmission for a plurality of UEs;
- coded for receiving the PDSCH transmission, wherein the PDSCH transmission includes a single transport block with data for the plurality of UEs;
- code for determining at least a portion of the data in the PDSCH transmission that is intended for the UE;
- code for sending a negative acknowledgement (NACK) for a previous PDSCH transmission; and
- code for monitoring for the PDCCH based on sending the NACK.

* * * * *